United States Patent [19]

Lewis et al.

[11] 4,224,467

[45] Sep. 23, 1980

[54] CORNER MOUNTED SOUND REPRODUCTION SPEAKER APPARATUS

[76] Inventors: Andrew G. Lewis, 1090 Webster La., Des Plaines, Ill. 60016; Bernard L. Kleinke, 853 Sanborn, Palatine, Ill. 60067

[21] Appl. No.: 919,347

[22] Filed: Jun. 26, 1978

[51] Int. Cl.$^2$ .......................... H04R 1/02; H05K 5/00

[52] U.S. Cl. ................................ 179/1 E; 179/1 GQ; 181/154

[58] Field of Search ........................ 179/1 GA, 146 E; 181/150, 154

[56] References Cited

U.S. PATENT DOCUMENTS

| | | | |
|---|---|---|---|
| 1,984,550 | 12/1934 | Sandeman | 179/146 E |
| 2,915,588 | 12/1959 | Bose | 179/1 E |
| 3,379,276 | 4/1968 | Goettl | 181/154 |
| 4,139,729 | 2/1979 | Gerzon | 179/1 GQ |

OTHER PUBLICATIONS

*Audio Engineering,* vol. 36, #1 pp. 15, 36, Jan. 1952, "Design For Smooth Response", V. Yeich.

*Audio Engineering* Mar. 1950, pp. 16–17, "A Symmetrical Corner Speaker", W. E. Gilson et al.

*Primary Examiner*—Thomas A. Robinson
*Attorney, Agent, or Firm*—Bernard L. Kleinke

[57] ABSTRACT

A corner mounted sound reproduction speaker apparatus is adapted to be mounted in a corner space defined in part by a pair of intersecting vertical surfaces and includes a hollow enclosure housing having a base and a pair of imperforate side faces adapted to engage and to overlie the respective ones of the pair of vertical surfaces. The enclosure housing also includes an inclined front face of a generally triangular shape. Speaker devices are mounted within the interior of the enclosure housing behind the front face and are adapted to be energized by a sound reproduction system, the speaker devices having a response in the range of about 20 cycles per second and about 20,000 cycles per second. The plane of the base is disposed at an angle relative to the axis of radiation of the speaker devices, and the angle is an angle between about 35° and about 50° so as to enable a pair of such speaker units to be employed in opposite corners of a room to produce a stereo effect throughout the room.

8 Claims, 10 Drawing Figures

FIG. 1
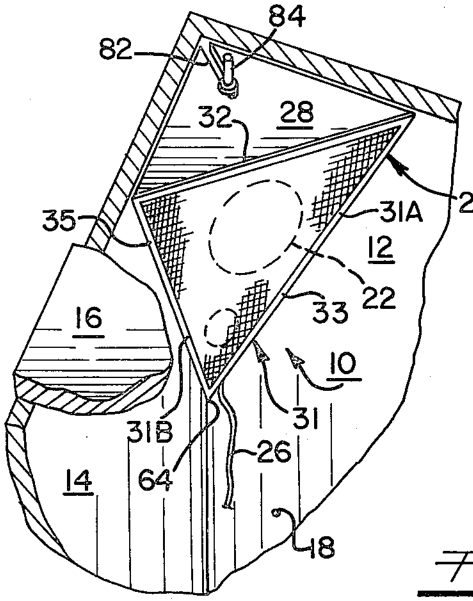
FIG. 2
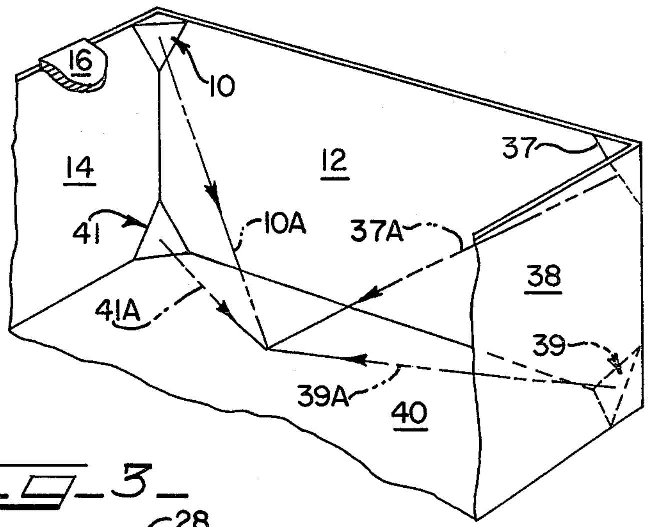
FIG. 3
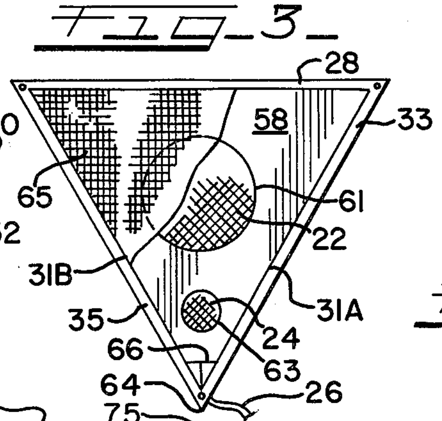
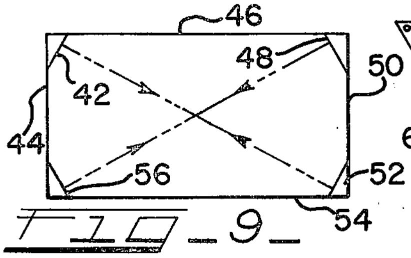
FIG. 9
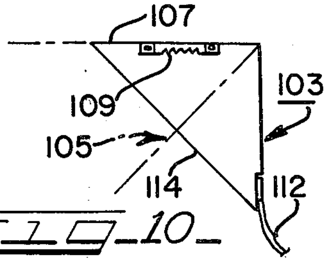
FIG. 10
FIG. 4
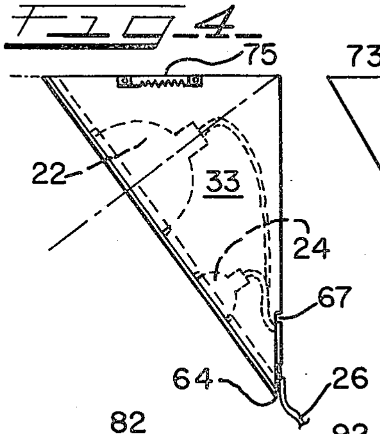
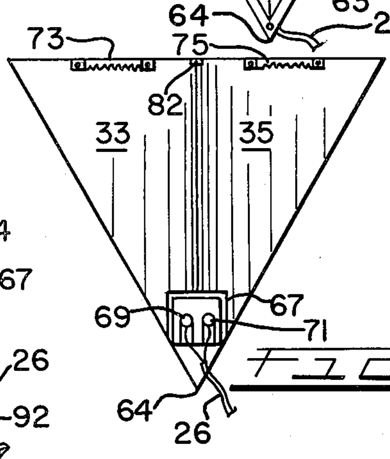
FIG. 5
FIG. 6
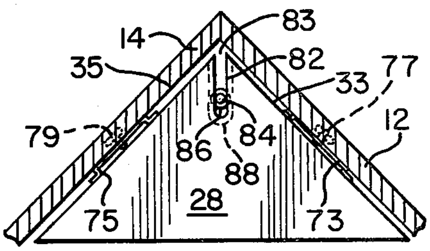
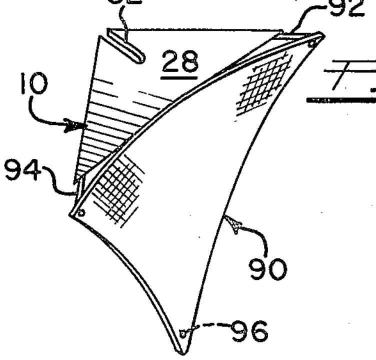
FIG. 7
FIG. 8
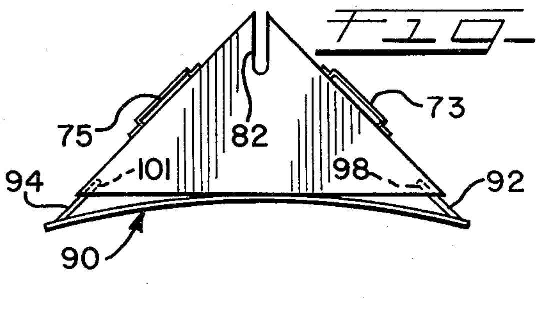

CORNER MOUNTED SOUND REPRODUCTION SPEAKER APPARATUS

BRIEF SUMMARY OF THE INVENTION

The present invention relates in general to a corner-mounted reproduction system speaker, and more particularly relates to sound reproduction speaker apparatus, which can be mounted in the corner space of a room and cooperates with other similar speaker apparatus mounted in other corners of the same room to produce stereo or quadraphonic audio effects from a suitable sound reproduction system.

In typical conventional sound reproduction stereo systems of the component type in use today, speakers mounted in rectangular box-like enclosures are positioned on the floor in a room spaced apart by desirable distances and directed toward a listening area so as to produce stereo or quadraphonic audio effects for the listener. However, oftentimes there is no floor space available in the desirable areas for the speakers to direct sound to the listening area in the room, and thus they must be positioned in a less desirable location. Moreover, such conventional speaker enclosures for home stereo systems many times do not fit in with the decor of the room, and in this regard, the user may not want to have speaker enclosures positioned on the floor in the room for aesthetic purposes. Additionally, such speaker enclosures occupy very valuable floor space. Therefore, it would be highly desirable to have a speaker apparatus which does not take up valuable floor space in a room and which cooperates with other similar speakers to produce stereo or quadraphonic effects over a large area of the room and not just a small limited listening area. Therefore, it would be highly desirable to have a speaker, which is adapted to be positioned in a corner of a room and which is capable of a broad range hi-fidelity response to reproduce stereo and quadraphonic audio effects. Corner and inclined face speakers have been known in the past. For example, the well-known Klipsch folded horn loud-speaker is designed for operation in the corner of the room for reproduction of the low-frequency range. In this regard, reference may be made to "Acoustical Engineering" by Harry F. Olson, D. Van Nostrand Company, Inc., 1957 at page 236. Thus, heretofore, corner speakers have not been employed for broad range hi-fidelity reproduction purposes. Hence, it would be highly desirable to have a corner speaker, which is convenient to use, and which can serve as a broad range hi-fidelity speaker. Also, such a speaker should be relatively inexpensive to manufacture and be aesthetically pleasing in appearance.

Therefore, it is the principal object of the present invention to provide a new and improved speaker apparatus which does not occupy valuable floor space and which cooperates with a similar speaker apparatus to provide stereo or quadraphonic effects from a sound reproduction system through a large area of the room.

Briefly, the above and further objects of the present invention are realized by providing a corner-mounted sound reproduction speaker, which is adapted to be mounted in a corner space defined in part by a pair of vertical surfaces intersecting at the corner space. The sound reproduction speaker includes a hollow enclosure housing having an imperforate base and a pair of imperforate side faces adapted to engage and to overlie the respective ones of the pair of vertical surfaces. The enclosure housing includes an inclined front face of a generally triangular shape. Speaker devices are mounted within the interior of the enclosure housing behind the front face and adapted to be electrically connected to and energized by a sound reproduction system. The plane of the base is disposed at an angle relative to a direction normal to the front face, and the angle is an angle in the range of between 35° and 50° so as to direct the sound down into the room at a steep angle. Thus, by mounting such a new and improved speaker apparatus in the corner of the room near the ceiling, the ceiling and the walls serve to enhance the sound reproduction qualities, and the sound is directed down into the room and is relatively unimpeded by furniture or other objects in the room as would otherwise be the case when the speakers are mounted on the floor as in conventional units. Such a speaker apparatus may be inverted and rest on the floor in the corner of the room to direct the sound upwardly into the room up away from any objects which would impede the sound reproduction qualities.

BRIEF DESCRIPTION OF DRAWINGS

Other objects and advantages of the present invention as well as others will become apparent to those skilled in the art when considered in connection with the accompanying drawings, wherein:

FIG. 1 is a pictorial view of a speaker apparatus which is constructed in accordance with the present invention and which is disposed in a corner space near the ceiling;

FIG. 2 is a diagrammatic pictorial view of a room showing how four similar speakers as shown in FIG. 1 of the drawings may be arranged to produce a quadraphonic effect;

FIG. 3 is a front elevational view of the speaker of FIG. 1;

FIG. 4 is a right-side elevational view of the speaker of FIG. 1;

FIG. 5 is a rear elevational view of the speaker of FIG. 1;

FIG. 6 is a plan view of another speaker apparatus, which is also constructed in accordance with the present invention;

FIG. 7 is a pictorial view of the speaker apparatus of FIG. 1 illustrating it with an attachment;

FIG. 8 is a plan view of the speaker apparatus;

FIG. 9 is another diagrammatic view of an arrangement of the speakers, such as the speaker shown in FIG. 1 of the drawings to produce a quadraphonic effect over a great portion of the interior space of a room; and FIG. 10 is a side view of another speaker apparatus according to the present invention.

DETAILED DESCRIPTION

Referring now to the drawings, and more particularly to FIGS. 1, 3, 4, 5 and 6 of the drawings, there is shown a corner mounted speaker 10, which is constructed in accordance with the present invention. As shown in FIG. 1 of the drawings, the speaker 10 may be mounted in overlying relationship with respect to a pair of intersecting vertical surfaces or walls 12 and 14 at a ceiling 16, the vertical surfaces 12 and 14 and the ceiling 16 defining a corner space 18 of a room or other space, such as a corner space of a bookcase. In this manner, the speaker 10 does not occupy any valuable floor space in the room, and the speaker 10 utilizes the walls 12 and 14 as well as the ceiling 16 to serve as a sounding board to enhance the acoustical response of the speaker 10.

The speaker 10 generally comprises an enclosure or housing 20 having a bass speaker 22 mounted therein, as well as a treble speaker 24 which are adapted to be electrically energized by a sound reproduction system via a speaker cord or cable 26, which conveniently extends down the walls 12 and 14 at their line of intersection in a relatively inconspicuous manner, or the cable 26 may extend through a hole (not shown) in one of the walls so that the cable 26 is entirely concealed within the walls of the room and thus is not visible at all.

The speaker enclosure or housing 20 includes a triangular base 28 which is disposed adjacent the ceiling 16 and extends in a horizontal plane. An inclined triangular face 31 of the housing 20 is joined along an edge 32 to the base 28. A pair of side triangularly-shaped faces 33 and 35 are joined to the front face 31 along the edges 31A and 31B as best seen in FiG. 3 of the drawings.

Referring now to FIG. 2 of the drawings, it will become apparent to those skilled in the art that the speaker 10 can be employed with other similar speakers, each of which is connected electrically to a quadraphonic sound reproduction system so as to achieve a quadraphonic audio effect. In this regard, a similar speaker 37 is mounted on the same wall 12 as the speaker 10 and an opposite wall 38 which intersects with the wall 12 near the ceiling 16 to direct its axis of radiation designated 37A downwardly into the room to intersect with the axis of radiation designated 10A from the speaker 10 as indicated in FIG. 2 of the drawings. A similar speaker 39 is inverted and rests on a floor 40 of the room, the floor intersecting with the three vertical walls 12, 14 and 38. The speaker 39 thus directs its axis of radiation designated 39A upwardly into the room to intersect with the axes of radiation from the speakers 10 and 37, as well as an axis of radiation designated 41A from another floor supported similar speaker 41 which is located in the corner below the speaker 10 resting on the floor 40. In this manner, since the four speakers direct the sound at an angle relative to the ceiling and the floor toward the center portion of the room, the sound is not otherwise impeded to any great extent by furniture and other objects in the room, as would ordinarily be the case with a conventional speaker not having an inclined axis of radiation and resting on the floor of the room.

It should be also understood, as indicated in FIG. 2 of the drawings that if a stereophonic sound reproduction system is employed, then any two of the four speakers may be employed so as to create the stereophonic effect.

Referring now to FIG. 9 of the drawings, there is shown another arrangement of four speakers, each of which is similar to the speaker 10, to provide a quadraphonic sound reproduction system. In this regard, a speaker 42 is mounted either at the floor or the ceiling of a room in a corner defined by a pair of intersecting vertical surfaces or walls 44 and 46. Similarly, a speaker 48 is disposed either at the floor or at the ceiling of the room at the intersection of the wall 46 and the wall 50. A speaker 52 is disposed at either the floor or the ceiling in the same room at the intersecting walls 50 and 54. In the remaining fourth corner of the same room, a speaker 56 is positioned either at the floor or at the ceiling at the corner defined by the intersecting of the wall 44 and 54. Once again, it should be understood that, while the system indicated in FIG. 9 of the drawings is a quadraphonic system, any two of the speakers may be employed in the manner indicated in FIG. 9 (either disposed at the floor or the ceiling), connected to a stereophonic sound reproduction system.

Considering now the speaker 10 in greater detail with reference to the drawings, it being understood that the other speakers shown in FIGS. 2 and 9 of the drawings are similar to it and therefore require no further description, the front face 31 includes a rigid inner wall 58 having a large centrally disposed opening 61 therein which is circular in shape and which is disposed opposite the bass speaker 22 to permit the sound to pass therethrough. A smaller opening 63 is disposed near the apex 64 of the enclosure housing 20 where the side faces 33 and 35 join the triangular face 31 at a point opposite the base 28. The smaller opening 63 is circular in shape and is disposed opposite the treble speaker 24 to permit the sound to pass therethrough. A triangularly-shaped perforate grill cloth 65 extends over the entire face of the inner wall 58 and a cut-off port opening 66 therein at the apex 64. In this regard, sound is permitted to pass through the grill cloth member 65 from the speakers 22 and 24, and the small port opening at the cut-off portion 66 of the inner wall 58 serves to vent the interior of the enclosure housing 20. As best seen in FIGS. 4 and 5 of the drawings, a recess 67 formed in the side walls 33 and 35 at the apex 64 has a pair of terminals 69 and 71 located therein. As a result, the speaker cable 26 is connected electrically to the terminals 69 and 71, and thus the enclosure housing 20 of the speaker 10 can be mounted flush against the walls 12 and 14 and yet the cable 26 can extend behind the speaker 10. In this regard, the depth of the recess 67 is sufficient to receive the speaker cable 26.

Considering now the manner in which the speaker 10 is mounted in position, as best seen in FIGS. 4, 5 and 6 of the drawings, a pair of sawtooth mounting brackets 73 and 75 are fixed to the respective side walls 33 and 35 at the upper edges thereof by any convenient means, such as fastening devices, such as wood screws. For the purpose of mounting the speaker 10 in position, a pair of fastening devices, such as anchor bolts 77 and 79, are fastened to the respective walls 12 and 14 with only their head portions extending from the surface of the walls. Therefore, the sawtooth brackets 73 and 75 can be rested upon the anchor bolts as shown in FIG. 6 of the drawings so as to support the speaker 10. Additionally, an open slot 82 in the base 28 extends to a rear apex 83. A bolt, such as a toggle bolt or other such anchoring device, 84 is secured in place in the ceiling 16 and depends therefrom to fit within the open slot 82, as best seen in FIGS. 1 and 6 of the drawings. In this regard, the speaker 10 may be mounted in place by merely positioning it with its base 28 into engagement with the ceiling 16 and then slid into the corner space 18, and in so doing, the bolt 84 is received within the slot 82. A head 86 of the bolt 84 fits under an undercut or lip 88 surrounding the slot 82 to prevent the bolt 84 from slipping out of engagement with the slot 82.

Referring now to FIGS. 7 and 8 of the drawings, there is shown a removable attachment 90 secured in place over the rectangular face 31 to provide the speaker 10 with a different aesthetically pleasing appearance. In this regard, the removable attachment 90 is generally triangular in shape and is dis-shaped or concave in shape to provide an attractive appearance. A series of three posts or studs 92, 94 and 96 extend rearwardly from the rear face of the attachment 90 and fit within holes such as the holes 98 and 101 for the posts 92 and 94 respectively. In this regard, the posts fit into their respective holes in a friction-type manner to secure the attachment 90 in place. The attachment 90 is preferably composed of porous material to serve as a grill cloth and may be molded in the shape as illustrated in the drawing. The attachment 90 is composed of suitable plastic material which is sufficiently porous to serve as a grill cloth to minimize the impedance presented to the sound emanating from the speaker 10. Thus, in order to change the appearance of the speaker 10, the attachment 90 may merely snap into position as shown in FIGS. 7 and 8 of the drawings, and thus the appearance of the speaker 10 is dramatically changed since the only visually discernible portion of the speaker 10 when positioned at the ceiling as illustrated in FIG. 1 of the drawings is the attachment 90.

Referring now to FIG. 10 of the drawings, there is shown a speaker 103, which is also constructed in accordance with the present invention and which is similar to the speaker 10 of FIG. 1, except that the angle between the axis of radiation and the base of the speaker is a 45° angle, as indicated in FIG. 10 of the drawings. In this regard, an axis of radiation 105 is disposed at an angle of approximately 45° with respect to the base 107 of the speaker 10. The speaker 10 includes a pair of sawtooth mounting brackets such as the bracket 109 and includes a speaker cable 112 adapted to be connected to a sound reproduction system (not shown). A triangular front face 114 of the speaker 103 is inclined downwardly as illustrated in FIG. 10 of the drawings, and the speaker 103 as illustrated in FIG. 10 is disposed in a position in which it would assume when positioned at the ceiling in a corner space as shown in FIG. 1 of the drawings.

It has been discovered that by constructing the speaker apparatus of the present invention with its axis of radiation disposed at an angle of between 35° and 50° relative to the base of the speaker, stereophonic and quadraphonic effects are achieved over a large area in the room when the speakers of the present invention have a response over a range of between approximately 20 cycles per second and approximately 20,000 cycles per second. A range of angles of between about 35° and about 42° provide the speakers of the present invention with better stereophonic and quadraphonic response in relatively larger rooms, such as rooms that are between 15 and 20 feet long or longer in length. An angle of approximately 37° is most preferred for the larger rooms, and the speaker 10 (FIG. 4) is constructed with such an angular relationship. A range of angles of between about 44° and about 50° provide the speakers of the present invention with better sterophonic and quadraphonic response in relatively smaller rooms, such as rooms that are between 10 and 14 feet long or shorter in length. An angle of approximately 45° is most preferred for the shorter rooms, and the speaker shown in FIG. 10 is constructed with such an angular relationship.

The embodiments of the invention in which an exclusive property or privilege is claimed are defined as follows:

1. In a corner mounted sound reproduction speaker apparatus, adapted to be connected electrically to a sound reproduction system and adapted to be mounted in a corner space defined in part by a pair of vertical surfaces intersecting at the corner space, the combination comprising:

a hollow enclosure housing having an imperforate generally triangular base and a pair of imperforate generally triangular side faces adapted to engage and to overlie the respective ones of the pair of vertical surfaces, said enclosure housing including inclined front face means of a generally triangular shape;

speaker means mounted within the interior of the enclosure housing behind said front face means and adapted to be connected electrically to and energized by the sound reproduction system to provide a range of response between about 20 cycles per second and about 20,000 cycles per second; and the plane of said base being disposed at an angle relative to a direction normal to said front face means, said angle being an angle in the range of between about 35° and about 50°, wherein said front face means includes a detachable perforate member removably attached to said side faces, one of said perforate member and said side faces having a plurality of rearwardly extending projections, the other one of said perforate member and said side faces having means defining a plurality of openings for receiving removably corresponding ones of said projections.

2. A corner mounted sound reproduction speaker apparatus according to claim 1, wherein said range is between about 35° and about 38°.

3. A corner mounted sound reproduction speaker apparatus according to claim 1, wherein said angle is about 37°.

4. A corner mounted sound reproduction speaker apparatus according to claim 1, wherein said side faces and front face means terminate in an apex disposed opposite said base, said front face means including an outer perforate member and a rigid inner wall disposed behind said outer member and configured of a generally triangular shape fixed to said side walls and said base for supporting said speaker means, said wall having opening means opposite said speaker means to permit sound to pass therethrough, said wall having a cut-off venting portion at said apex to permit sound to pass therethrough, said outer member having an apex portion extending beyond said cut-off portion at said apex.

5. A corner mounted sound reproduction speaker apparatus according to claim 1, wherein said side faces and said front face means terminate in an apex disposed opposite said base, further including means defining a recess in said side walls at said apex, terminal means mounted in said recess and connected electrically to said speaker means, said terminal means being adapted to be connected electrically to the sound reproduction system.

6. A corner mounted sound reproduction speaker apparatus according to claim 1, further including means defining an open slot in said base for receiving a fastening device to mount the speaker apparatus to a horizontal surface, said slot being open at the intersection between the side faces.

7. A corner mounted sound reproduction speaker apparatus according to claim 1, further including a second speaker apparatus positioned in another corner space of the same room and connected electrically to said sound reproduction system, the first-mentioned apparatus and said second apparatus being mounted at the ceiling in said same room.

8. A corner mounted sound reproduction speaker apparatus according to claim 7, further including a third speaker apparatus and a fourth speaker apparatus, said third apparatus and said fourth apparatus each being adapted to be connected electrically to said sound reproduction system, said first and second speaker apparatuses being positioned in corner spaces in said same room and said third and fourth speaker apparatus being positioned in the corner spaces in said same room at the ceiling thereof at a common wall with said first and second speaker apparatuses.

* * * * *